(12) United States Patent
Fukuda (10) Patent No.: US 11,942,914 B2
(45) Date of Patent: Mar. 26, 2024

(54) NOISE FILTER AND WIRE HARNESS

(71) Applicant: SUMITOMO WIRING SYSTEMS, LTD., Mie (JP)

(72) Inventor: Takao Fukuda, Mie (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 537 days.

(21) Appl. No.: 17/261,105

(22) PCT Filed: Aug. 7, 2019

(86) PCT No.: PCT/JP2019/031079
§ 371 (c)(1),
(2) Date: Jan. 18, 2021

(87) PCT Pub. No.: WO2020/032093
PCT Pub. Date: Feb. 13, 2020

(65) Prior Publication Data
US 2021/0316676 A1    Oct. 14, 2021

(30) Foreign Application Priority Data
Aug. 7, 2018   (JP) ................................ 2018-148202

(51) Int. Cl.
*H03H 1/00* (2006.01)
*B60R 16/02* (2006.01)
*H03H 7/01* (2006.01)
*H01R 13/66* (2006.01)

(52) U.S. Cl.
CPC ....... *H03H 1/0007* (2013.01); *B60R 16/0207* (2013.01); *H03H 7/0115* (2013.01); *H01R 13/6625* (2013.01); *H03H 2001/0028* (2013.01); *H03H 2001/0042* (2013.01)

(58) Field of Classification Search
CPC .......................... H03H 7/0115; H03H 1/0007
USPC ......................................... 333/175, 181, 185
See application file for complete search history.

(56) References Cited

U.S. PATENT DOCUMENTS

| 8,098,115 B2 | 1/2012 | Oiwa et al. |
| 2012/0289087 A1 | 11/2012 | Fujisaki |

FOREIGN PATENT DOCUMENTS

| JP | 58-081924 | 6/1983 |
| JP | 2012-039201 | 2/2012 |
| JP | 2012-238710 | 12/2012 |
| JP | 5210492 | 6/2013 |

OTHER PUBLICATIONS

Official Communication issued in International Bureau of WIPO Patent Application No. PCT/JP2019/031079, dated Oct. 8, 2019, along with and English translation thereof.

*Primary Examiner* — Rakesh B Patel
(74) *Attorney, Agent, or Firm* — GREENBLUM & BERNSTEIN, P.L.C.

(57) ABSTRACT

The present invention provides a noise filter that can provide a wire linking a power source and a load along a desired path regardless of an installation location of the noise filter. A noise filter is connected to a wire of a wire harness linking a power source and a load and eliminates noise transmitted from the power source to the load. The noise filter includes a housing, a capacitor that is housed inside the housing, a ground terminal that is connected to the capacitor, and a noise filter wire that has a first end connected directly to the capacitor and a second end connected by splicing to a middle portion of the wire of the wire harness.

17 Claims, 5 Drawing Sheets

NOISE FILTER AND WIRE HARNESS

FIELD OF THE INVENTION

The present invention relates to a noise filter and to a wire harness for a vehicle provided with the noise filter.

BACKGROUND OF THE INVENTION

For example, in the noise eliminating wire harness illustrated in Patent Literature 1, a noise filter that includes a capacitor as a noise prevention element is provided at a middle portion of a wire that links a power source and a load (for example, a defogger circuit), and noise transmitted from the power source to the load is reduced. The capacitor, a ground terminal that is connected to one electrode of the capacitor, and a connection terminal that is connected to the other electrode of the capacitor are installed in a housing for the noise filter having the above configuration. In addition, the housing of the noise filter is provided directly on the wire, and the capacitor and the wire are electrically connected via the connection terminal provided inside the housing. Also, the ground terminal of the noise filter is connected to a vehicle body panel of a vehicle and is thereby grounded.

RELATED ART

Patent Literature

Patent Literature 1: Japanese Patent No. 5,210,492

SUMMARY OF THE INVENTION

Problems to be Solved by the Invention

In the configuration given in Patent Literature 1, the noise filter is provided directly on the wire, and therefore when an installation location for the noise filter cannot be ensured on a desired path for the wire, extra length must be provided to the wire and the wire must be detoured to the installation location of the noise filter, which causes the ease of installing a wire harness to deteriorate.

In addition, a similar issue occurs in a configuration given as a conventional example in Patent Literature 1 (see FIGS. 5, 6, and 7 in Patent Literature 1). Specifically, the conventional example has a configuration where a middle portion of a wire is cut to form a pair of terminal lines (capacitor connection circuits 17 and 18 in Patent Literature 1) that connect to the capacitor, and therefore when a noise filter is installed at a position away from a desired path for the wires, the wires (terminal lines) must deviate from the desired path.

In order to resolve the above-noted issue, the present invention provides a noise filter and wire harness that can provide a wire linking a power source and a load along a desired path regardless of an installation location of the noise filter.

Means for Solving the Problems

A noise filter resolving the above-noted issue is connected to a wire of a wire harness linking a power source and a load and eliminates noise transmitted from the power source to the load, and includes a housing, a capacitor that is housed inside the housing, a ground terminal installed on the housing and having a connecting portion connected to one electrode of the capacitor and a grounding portion that is grounded on a vehicle body panel, and a noise filter wire that has a first end connected directly to the other electrode of the capacitor and a second end connected by splicing to a middle portion of the wire of the wire harness.

A wire harness resolving the above-noted issue is provided with a wire that links a power source and a load, and a noise filter having a noise filter wire that is connected by splicing to a middle portion of the wire. A noise filter resolving the above-noted issue is connected to a wire of a wire harness linking a power source and a load and eliminates noise transmitted from the power source to the load, and is provided with a housing that includes a cylindrical outer circumferential wall that encompasses four sides, a bottom that seals one end of the outer circumferential wall, and an opening that is formed on the end of the outer circumferential wall that is on the opposite side from the bottom; a capacitor that is housed inside the outer circumferential wall; a ground terminal that is connected to one electrode of the capacitor; and a noise filter wire that electrically connects the other electrode of the capacitor to the wire of the wire harness, where the ground terminal includes a portion inside the housing that is positioned inside the outer circumferential wall and a grounding portion extending outside the housing through the opening and grounded on a vehicle body panel, and the outer circumferential wall is provided with a retainer portion that holds the ground terminal.

Effect of the Invention

According to the noise filter and wire harness of the present invention, a wire linking a power source and a load can be provided along a desired path regardless of an installation location of the noise filter.

MODE FOR CARRYING OUT THE INVENTION

In the following, an embodiment of a noise filter and wire harness is described with reference to the drawings. An X axis of XYZ axes in the drawings indicates a width direction of a noise filter 14 (housing 21), a Y axis is orthogonal to the X axis and indicates an inward direction of the noise filter 14, and a Z axis is orthogonal to an XY plane and indicates a height direction of the noise filter 14. In the drawings, portions of the configuration may be exaggerated or simplified for ease of illustration. Also, the dimensional ratios of the various components may differ from reality.

Figure 1:
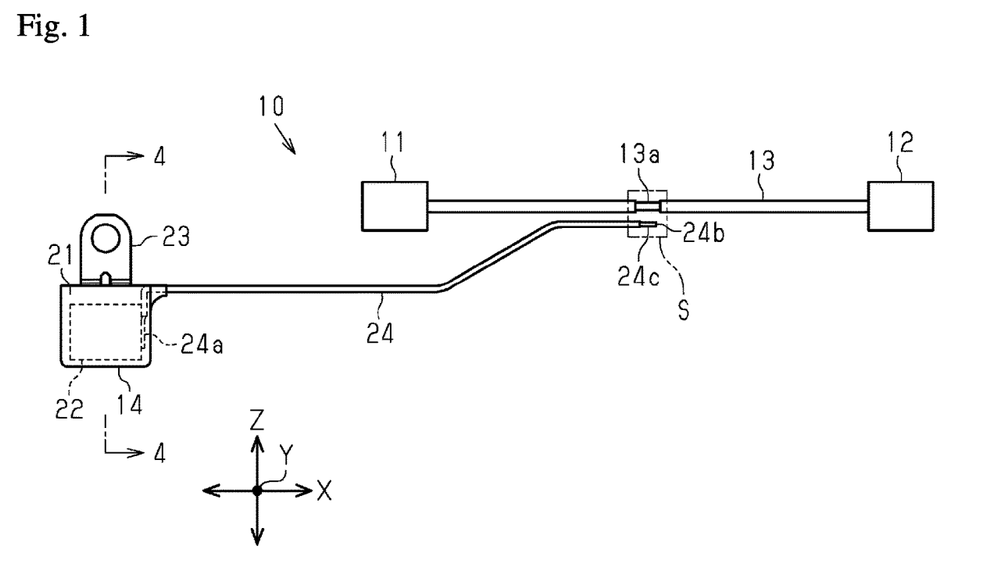
FIG. 1 is a schematic configuration diagram of a wire harness according to an embodiment.

As illustrated in FIG. 1, a vehicle wire harness 10 according to the present embodiment includes a wire 13 that links a power source 11 and a load 12, and the noise filter 14 that is connected to the wire 13. The wire 13 is a coated wire in which a core wire configured by a conductor is covered by an insulating coating, and electricity from the power source 11 is supplied to the load 12 via the wire 13. The wire 13 is routed in the vehicle on a predetermined path. The wire harness 10 is configured by forming a plurality of wires that include the wire 13 into a bundle, but wires other than the wire 13 are omitted from the drawings.

The power source 11 is a generator (alternator) in an automobile and supplies power to various loads, including the load 12, by generating electricity having a three-phase current and using a diode inside a regulator to rectify the current. However, since the current is not completely rectified, the power source 11 supplies the load 12 with electricity that contains noise. An example of the load may include a defogger circuit for a rear windshield of a vehicle, for example. Generally, a defogger circuit is often provided near an AM radio antenna, and because the defogger circuit converts electricity into heat, the circuit uses a large amount of power and generates significant noise. Therefore, the noise generated by the defogger circuit is likely to affect the AM radio antenna.

The noise filter 14 includes a resin housing 21, a capacitor 22 serving as a noise prevention element that is housed inside the housing 21, a ground terminal 23 that is connected to one electrode of the capacitor 22, and a noise filter wire 24 (also referred to simply as a wire 24 below) that is connected to the other electrode of the capacitor 22. The interior of the housing 21 is filled with a potting material 25 composed of epoxy resin, for example.

The noise filter wire 24 is a coated wire in which a core wire configured by a conductor is covered by an insulating coating. A first end 24a of the noise filter wire 24 is connected to the capacitor 22, and a second end 24b side of the noise filter wire 24 is connected by splicing to a middle portion of the wire 13. Specifically, an exposed portion 13a, where the core wire is exposed by middle stripping the insulating coating, is formed at the middle portion of the wire 13. In addition, an exposed portion 24c, where the core wire is exposed by end stripping the insulating coating, is formed on the second end 24b of the noise filter 24. Then, the exposed portion 13a of the wire 13 and the exposed portion 24c of the noise filter wire 24 are lined up so as to be substantially parallel to each other, and the exposed portions 13a and 24c are crimped by a splice terminal S.

Figure 2:
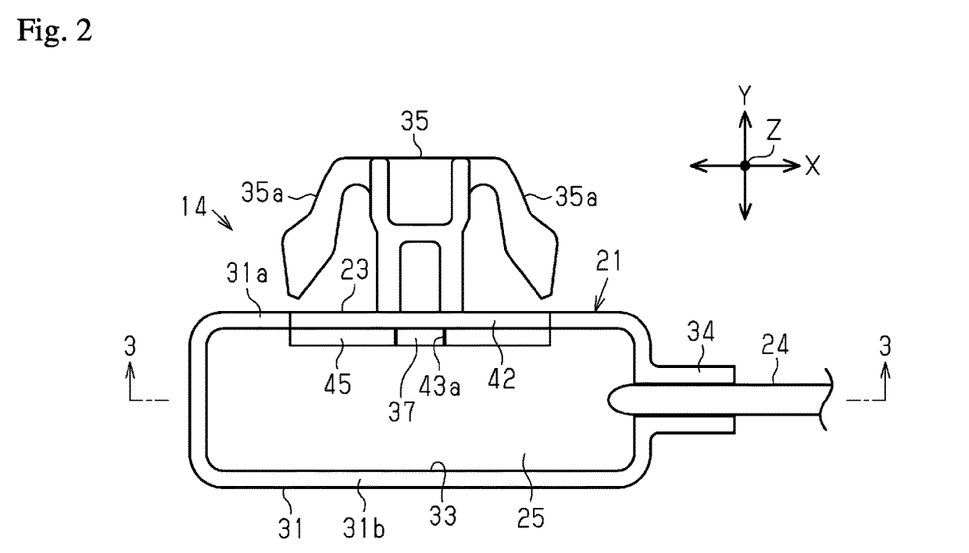
FIG. 2 is a plan view of a noise filter according to the embodiment.
Figure 3:
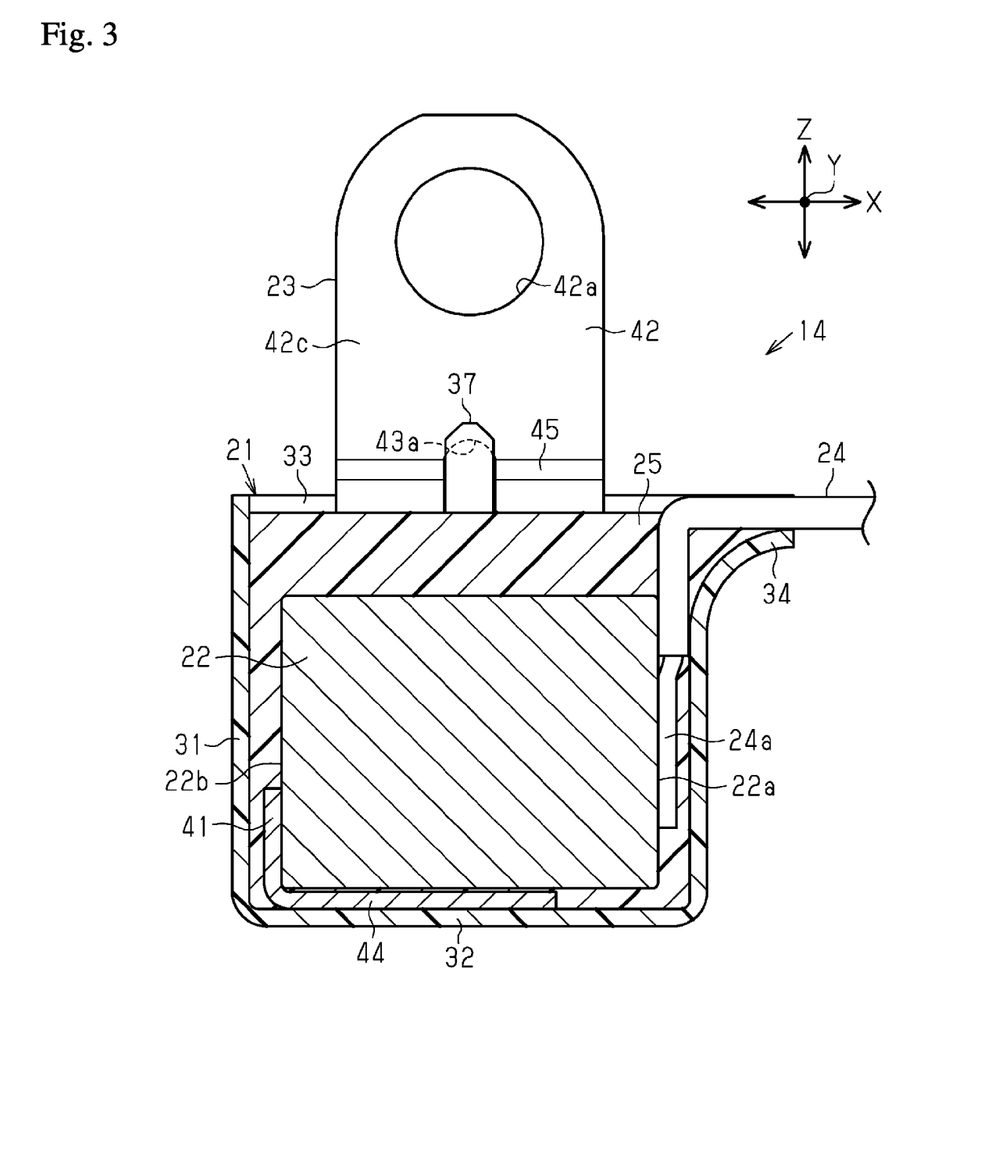
FIG. 3 is a cross-sectional view along a line 3-3 in FIG. 2.

As illustrated in FIGS. 2 and 3, the housing 21 has a cylindrical outer circumferential wall 31 that opens in the height direction Z and a bottom 32 (see FIG. 3) that closes off one end of the outer circumferential wall 31 in the height direction Z. In the following description, the bottom 32 side is described as downward in the height direction Z of the housing 21, and an opening 33 side on the opposite side from the bottom 32 is described as upward in the height direction Z. The housing 21 has a rectangular parallelepiped shape that only opens upward. In other words, the outer circumferential wall 31 has a substantially rectangular shape in plan view (view in the height direction Z). A wire lead-out portion 34 is formed on a top end of the outer circumferential wall 31 on a first end side of the width direction X of the outer circumferential wall 31, the wire lead-out portion 34 guiding a lead-out portion of the wire 24 that is led outside the housing 21 through the opening 33.

The outer circumferential wall 31 is configured to include a pair of walls (first wall 31a and second wall 31b) that face each other in the inward direction Y of the housing 21. The first wall 31a and second wall 31b each form a flat plate shape perpendicular to the inward direction Y of the housing 21. The first wall 31a and second wall 31b are parallel to each other.

Figure 4:
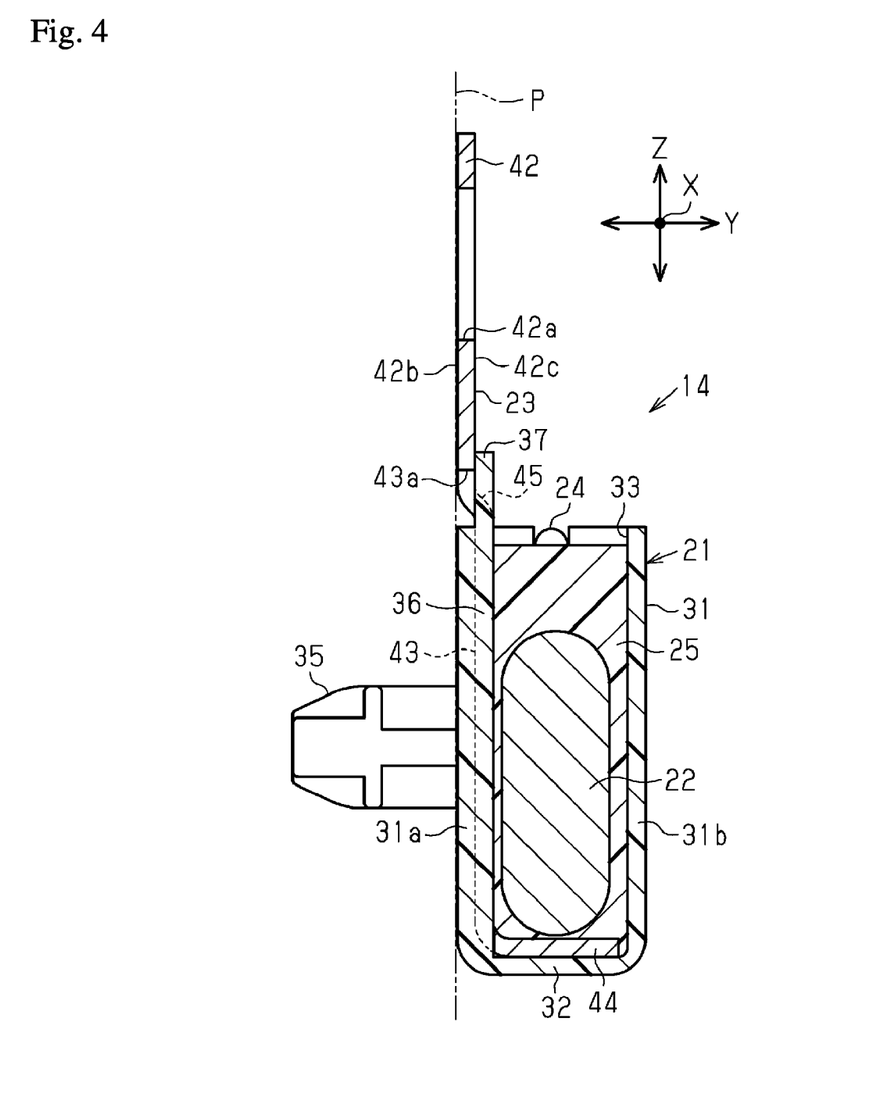
FIG. 4 is a cross-sectional view along a line 4-4 in FIG. 1.

As illustrated in FIG. 4, a fixation portion 35 that is fixed to a vehicle body panel P is integrally molded on an outer surface of the first wall 31a. Overall, the fixation portion 35 projects along the inward direction Y of the housing 21. In other words, the overall projection direction of the fixation portion 35 runs from the outer surface of the first wall 31a and is perpendicular to the opening direction of the opening 33 (direction that follows the height direction Z). In addition, the fixation portion 35 according to the present embodiment includes a pair of engagement portions 35a that extend toward the first wall 31a from a forefront end portion that is inserted through to a back side of the vehicle body panel P (see FIG. 2).

Figure 6:
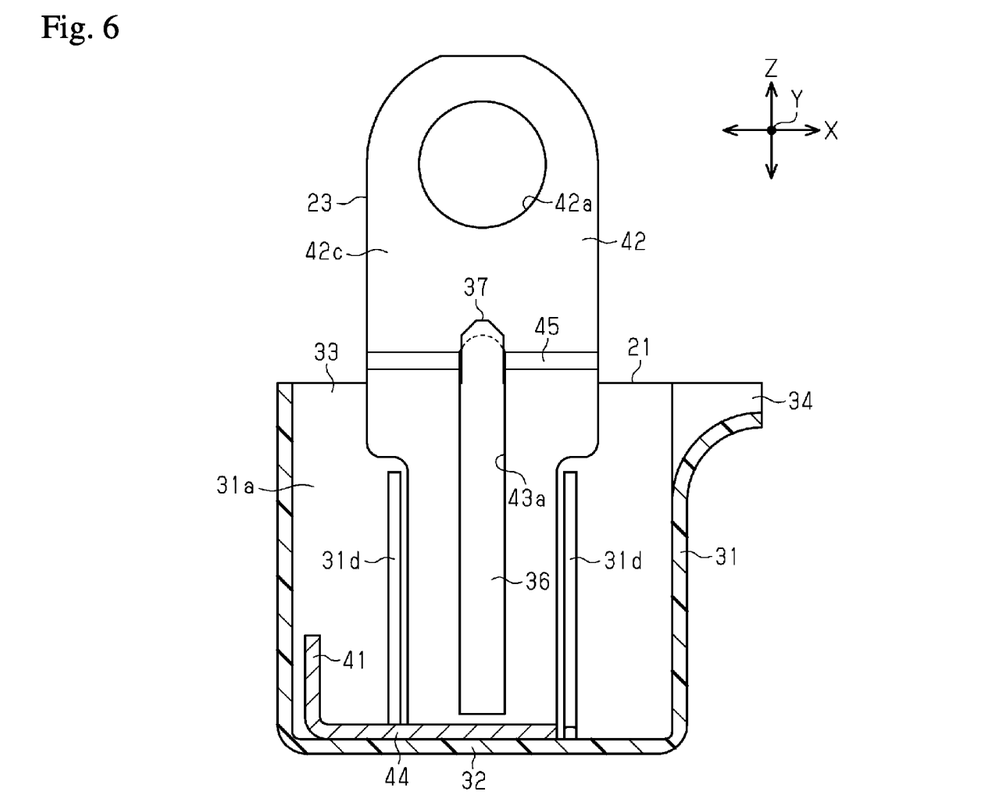
FIG. 6 is a cross-sectional view illustrating a housing and a ground terminal according to the embodiment.

As illustrated in FIGS. 4 and 6, the ground terminal 23 is formed by a press-worked metal plate, and is accommodated in the housing 21 such that a portion of the ground terminal 23 projects out through the opening 33. The ground terminal 23 is a metal terminal that integrally includes a connection portion 41 connected inside the housing 21 to the capacitor 22, a grounding portion 42 that is led outside the housing 21 and is grounded on the vehicle body panel P, and a linking portion 43 that joins the connection portion 41 and the grounding portion 42.

The portion of the linking portion 43 that is arranged inside the housing 21 is provided along an inner surface of the first wall 31a and, in the present embodiment, the linking portion 43 is in contact with the inner surface of the first wall 31a. In other words, the linking portion 43 corresponds to a contact portion that makes contact with the first wall 31a.

A bent portion 44 that bends at substantially a right angle along the bottom 32 is formed at a lower end of the linking portion 43 in the height direction Z (end on the bottom 32 side). The connection portion 41 that is connected to the capacitor 22 is formed so as to extend upward in the height direction Z from one width direction X end of the bent portion 44.

As illustrated in FIG. 6, the linking portion 43 of the ground terminal 23 has a slit 43a that is formed in a straight line shape that follows the height direction Z. On the other hand, a regulating portion 36 that projects into the housing 21 is formed on the inner surface of the first wall 31a of the housing 21. The regulating portion 36 extends in a straight line shape that follows the height direction Z. Also, the regulating portion 36 is fitted to the slit 43a on the ground terminal 23 side. Thus, displacement of the ground terminal 23 in the width direction X is regulated in a state prior to filling in the potting material 25.

As illustrated in FIG. 4, the grounding portion 42 of the ground terminal 23 that is led out of the housing 21 extends upward in the height direction Z. The grounding portion 42 has a plate shape that is perpendicular to the inward direction Y. A bolt insertion hole 42a for fixing the grounding portion 42 to the vehicle body panel P using a bolt that is not shown in the drawings is formed in the grounding portion 42 by perforation. By fixing the grounding portion 42 to the vehicle body panel P, the capacitor 22 is body grounded.

A step portion 45 is formed at a position running from the linking portion 43 to the grounding portion 42 on the ground terminal 23. Through the step portion 45, the grounding portion 42 displaces in the opposite direction from the opening side in the inward direction Y. In other words, the grounding portion 42 is formed to be offset from the linking portion 43 in the inward direction Y. The grounding portion 42 is thereby configured so as to be located above the first wall 31a in the height direction Z. In addition, in the present embodiment, the plate thickness of the grounding portion 42 and the plate thickness of the first wall 31a are defined to be equal in the inward direction Y. Accordingly, a first surface 42b of the grounding portion 42 that makes contact with the vehicle body panel P and the outer surface of the first wall 31a are flush to each other and a second surface 42c (reverse face of the first surface 42b) of the grounding portion 42 and the inner surface of the first wall 31a are flush to each other.

As illustrated in FIGS. 4 and 6, a retainer portion 37 is formed on a top end portion of the regulating portion 36, the retainer portion 37 extending upward in the height direction Z (toward the exterior of the housing 21) through the opening 33 of the housing 21. The retainer portion 37 extends further upward than a top end of the slit 43a of the ground terminal 23 and also is in contact with the second surface 42c of the grounding portion 42. In other words, the retainer portion 37 holds a reverse face side of a surface of the ground terminal 23 that faces the first wall 31a.

Figure 5:
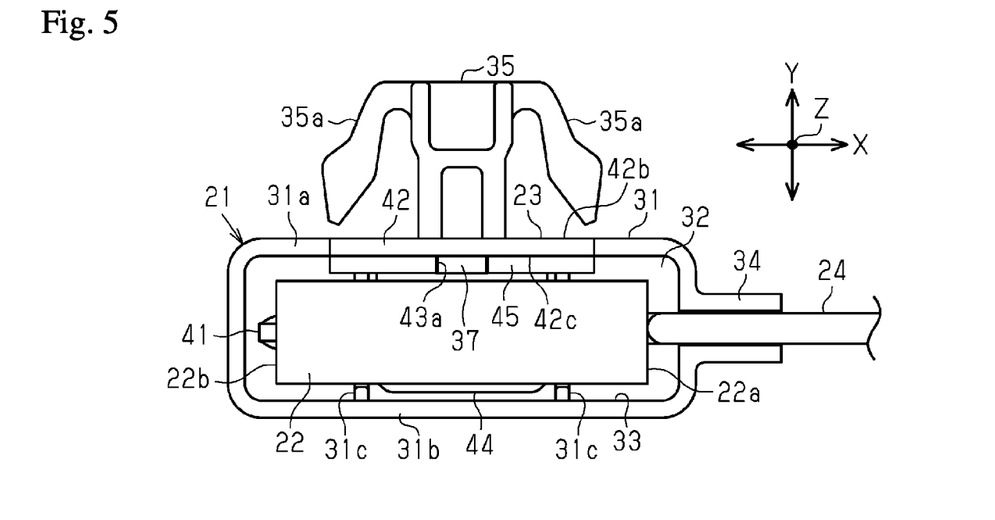
FIG. 5 is a plan view of the noise filter prior to filling with a potting material.

As illustrated in FIGS. 3, 4, and 5, the capacitor 22 is a wound film capacitor and is provided such that the width direction (winding axis direction) of the capacitor 22 is substantially parallel to the width direction X of the housing 21. Each end face 22a and 22b on both sides of the width direction (X axis direction) of the capacitor 22 is configured as an electrode surface. In addition, the capacitor 22 is arranged above the bent portion 44 of the ground terminal 23 in the height direction Z, and faces the linking portion 43 of the ground terminal 23 in the inward direction Y.

The first end 24a of the wire 24 is directly connected, by welding or soldering, to one of the end faces, 22a, that serves as an electrode surface. The wire 24 extends upward in the height direction Z from the first end 24a that is connected to the end face 22a of the capacitor 22, and is bent near the opening 33 and led in the width direction X out through the wire lead-out portion 34 (see FIG. 3). In addition, the connecting portion 41 of the ground terminal 23 is directly connected, by welding or soldering, to the other of the end faces, 22b, that serves as an electrode surface of the capacitor 22.

As illustrated in FIG. 5, two ribs 31c are formed on the second wall 31b of the outer circumferential wall 31, projecting in the inward direction Y from the inner surface of the second wall 31b. Each of the ribs 31c extends in a straight line shape that follows the height direction Z. In addition, each of the ribs 31c is formed to project an equal amount as the other. A forefront end of each rib 31c in the inward direction Y is capable of making contact with the capacitor 22 housed in the housing 21. In other words, with respect to the second wall 31b, the capacitor 22 only makes contact with the ribs 31c and does not make contact with the inner surface of the second wall 31b itself, and so a gap equal to or greater than the projection amount of the ribs 31c is ensured between the capacitor 22 and the inner surface of the second wall 31b itself. This allows the potting material 25 to be filled readily in a state where the capacitor 22 is housed in the housing 21.

As illustrated in FIG. 6, a pair of ribs 31d that extend in a straight line shape that follows the height direction Z are formed projecting on the inner surface of the first wall 31a. Each of the ribs 31d of the first wall 31a are formed at the same positions in the width direction X as each of the ribs 31c of the second wall 31b, described above. In addition, in the present embodiment, each of the ribs 31d and 31c are defined so as to project an equal amount with respect to one another in the inward direction Y.

The potting material 25 that is filled into the housing 21 covers the entire capacitor 22, the connecting portion 41 of the ground terminal 23 that is connected to the capacitor 22, and the site of connection between the capacitor 22 and the first end 24a of the wire 24. Accordingly, infiltration of water and the like into the housing 21 is prevented and corrosion at the sites where the ground terminal 23 and the wire 24 are connected to the capacitor 22 can be prevented.

Figure 7:
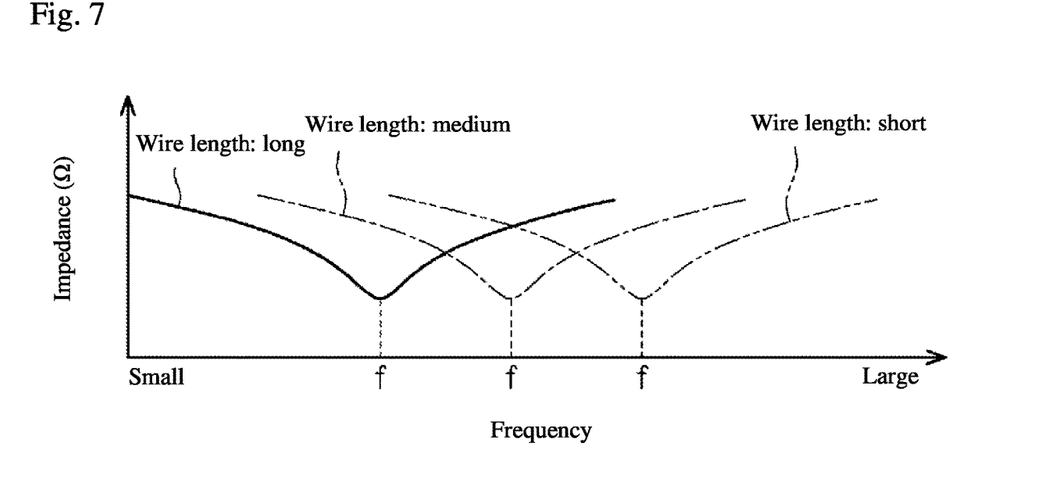
FIG. 7 is a graph explaining a relationship between the length of a noise filter wire and frequency characteristics of the noise filter in the embodiment.

FIG. 7 is a graph explaining the relationship between the length of the noise filter wire 24 and frequency characteristics of the noise filter 14. The solid line graph, the one-dash line graph, and the two-dash line graph in FIG. 7 respectively show the frequency characteristics (noise elimination characteristics) of the noise filter 14 when the length of the noise filter wire 24 is changed. The length of the noise filter wire 24 has a shorter setting in the order of the solid line graph, the one-dash line graph, and the two-dash line graph. As illustrated in FIG. 7, the shorter the noise filter wire 24 becomes, the greater a self-resonant frequency f (frequency where elimination is easy for the noise filter 14) becomes. In other words, with the noise filter 14 according to the present embodiment, the frequency characteristics (noise elimination characteristics) can be adjusted by changing the length of the wire 24.

A function of the present embodiment is described. When power is supplied from the power source 11 to the load 12, noise carried in the electric current is dampened by an effect of the capacitor 22. Accordingly, noise transmitted from the power source 11 to the load 12 is decreased.

Effects of the present embodiment are described.

(1) The noise filter 14 includes the capacitor 22 that is housed inside the housing 21, the ground terminal 23 that is connected to the capacitor 22, and the noise filter wire 24 in which the first end 24a is directly connected to the capacitor 22 and the second end 24b is connected by splicing to a middle portion of the wire 13 of the wire harness 10.

According to this aspect, the wire 13 of the wire harness 10 linking the power source 11 and the load 12 is connected to the capacitor 22 via the noise filter wire 24. Therefore, even when an installation location of the noise filter wire 24 has to be set to a location far from a desired path of the wire 13, the noise filter 14 and the wire 13 can be connected without changing the path of the wire 13. That is, regardless of the installation location of the noise filter 14, the wire 13 can be provided along a desired path.

In addition, due to the configuration that directly connects the first end 24a of the noise filter wire 24 to the capacitor 22 that is housed within the housing 21, there is no need to provide components such as a terminal to connect the capacitor 22 and the noise filter wire 24 inside the housing 21. Thus, the noise filter 14 (housing 21) can be made more compact and, as a result, an installation location for the noise filter 14 can be readily ensured.

(2) Both of the end faces 22a and 22b of the capacitor 22 in the width direction, which each have a flat shape, are configured as electrode surfaces of the capacitor 22, and the first end 24a of the noise filter wire 24 is directly connected to one end face of the capacitor 22 in the width direction (X axis direction) by welding or soldering. This aspect yields a configuration where the noise filter 14 can be made even more compact.

(3) The housing 21 includes the cylindrical outer circumferential wall 31 that encompasses four sides, the bottom 32 that seals one end of the outer circumferential wall 31, and the opening 33 that is formed on the end of the outer circumferential wall 31 that is on the opposite side from the bottom 32. The outer circumferential wall 31 is configured to include the first wall 31a and the second wall 31b, which are parallel to each other. In addition, the ground terminal 23 has the linking portion 43 that is provided inside the outer circumferential wall 31 and makes contact with the first wall 31a, and the connecting portion 41 extending from the linking portion 43 extends outside the housing 21 along the opening direction of the opening 33 (height direction Z).

According to this aspect, the ground terminal 23 can be connected to the capacitor 22 inside the housing 21, and can also be grounded by the grounding portion 42 that is outside the housing 21. In addition, the linking portion 43 of the ground terminal 23 makes contact with the first wall 31a of the housing 21, and therefore an installation posture of the ground terminal 23 relative to the housing 21 is stable.

(4) The first wall 31a includes the retainer portion 37 that holds a reverse face side (second surface 42c side) of the surface of the ground terminal 23 that faces the first wall 31a. According to this aspect, the installation posture of the ground terminal 23 relative to the housing 21 is even more stable. As a result, when filling the potting material 25, the ground terminal 23 can be prevented from falling inward (away from the first wall 31a).

(5) The fixation portion 35 that is fixed to the vehicle body panel P is integrally molded on the first wall 31a so as to project from the outer surface of the first wall 31a in a direction (inward direction Y) perpendicular to the opening direction of the opening 33 (height direction Z). According to this aspect, when injection molding the housing 21, the fixation portion 35 can be integrally molded without using a slide die. In other words, the housing 21 with the integral fixation portion 35 can be molded with a die configuration having fewer components.

(6) Two ribs 31c that project toward the interior of the housing 21 and make contact with the capacitor 22 are provided on the second wall 31b. According to this aspect, a gap equal to or greater than a projection amount of the ribs 31c can be ensured between the capacitor 22 and the second wall 31b. This allows the potting material 25 to be filled readily in a state where the capacitor 22 is housed in the housing 21.

(7) The noise filter 14 is provided with the potting material 25 that is filled into the housing 21 so as to cover the capacitor 22, the connecting portion 41 of the ground terminal 23, and the site of connection between the capacitor 22 and the first end 24a of the wire 24. According to this aspect, infiltration of water and the like into the housing 21 can be prevented and corrosion at the sites where the ground terminal 23 and the wire 24 are connected to the capacitor 22 can be prevented.

In addition, the noise filter 14 according to the present embodiment is a coverless structure that has no cover member engaged and fixed on the housing 21 that is intended to cover the opening 33, and therefore the issue of a cover member detaching when handling the wire 24, for example, does not arise.

(8) The housing 21 is provided with the regulating portion 36 that regulates the displacement of the ground terminal 23 in the width direction X. According to this aspect, in a state prior to filling in the potting material 25, displacement of the ground terminal 23 in the width direction X can be regulated, and also positional deviation of the ground terminal 23 in the width direction X when filling in the potting material 25 can be inhibited. In addition, in the present embodiment, when the ground terminal 23 is installed inside the housing 21 through the opening 33, the regulating portion 36 is inserted into the slit 43a of the ground terminal 23 and thereby serves as a guide for installing the ground terminal 23. Also, the regulating portion 36 allows width direction X positioning of the ground terminal 23 and the capacitor 22 with respect to the housing 21.

(9) The bent portion 44 that is positioned on the lower side of the height direction Z is formed on the ground terminal 23. In assembling the noise filter 14, the ground terminal 23 and the capacitor 22 are connected by welding or soldering prior to being housed in the housing 21. At this point, the capacitor 22 can be held by the bent portion 44 of the ground terminal 23 and assembly workability can be improved.

(10) A base end (lower end) of the regulating portion 36 is continuous with the bottom 32. In addition, a projection length of the regulating portion 36 in the inward direction Y, including the retainer portion 37 at a forefront end, is formed to be uniform across the entire height direction Z. This allows the regulating portion 36 and the retainer portion 37 to be integrally molded without using a slide die when injection molding the housing 21.

(11) The linking portion 43 of the ground terminal 23, which serves as a portion inside the housing, makes contact with the inner surface of the first wall 31a that configures a portion of the outer circumferential wall 31. In addition, the retainer portion 37 holds the ground terminal 23 so as to maintain the state of contact of the linking portion 43 with the inner surface of the first wall 31a. Accordingly, the retainer portion 37 can inhibit the ground terminal 23 from separating from the first wall 31a. Also, by arranging the ground terminal 23 so as to make contact with the first wall 31a, space for arranging the capacitor 22 inside the housing 21 is more readily ensured.

(12) The housing 21 has, on the outer surface of the first wall 31a, the fixation portion 35 that is fixed to the vehicle body panel P. Accordingly, in a state where the housing 21 is fixed to the vehicle body panel P by the fixation portion 35, the ground terminal 23 that makes contact with the inner surface of the first wall 31a can be brought closer to the vehicle body panel P.

(13) The linking portion 43 and the grounding portion 42 that extends from the linking portion 43 to outside the housing 21 are both plate shaped. The grounding portion 42 displaces toward the first wall 31a, relative to the linking portion 43 that is in contact with the inner surface of the first wall 31a. In addition, the grounding portion 42 is arranged so as to align with the first wall 31a in the height direction Z, which is parallel to the opening direction of the opening 33. Accordingly, the grounding portion 42 of the ground terminal 23 can be brought closer to the vehicle body panel P. Also, in the present embodiment, the first surface 42b of the grounding portion 42, which is in contact with the vehicle body panel P, and the outer surface of the first wall 31a are flush to each other, and therefore the noise filter 14 can be brought into contact with the vehicle body panel P without rattling. Therefore, ease of installing the noise filter 14 on the vehicle body panel P is improved.

(14) The grounding portion 42 includes the first surface 42b that is continuous with the surface of the linking portion 43 that is in contact with the inner surface of the first wall 31a, and the second surface 42c, which is the reverse face of the first surface 42b. In addition, the retainer portion 37 is provided so as to extend out of the housing 21 past the opening 33 and also touches the second surface 42c of the grounding portion 42. According to this configuration, the retainer portion 37 touches the second surface 42c of the grounding portion 42 that projects out of the housing 21, and therefore the ground terminal 23 falling in a direction away from the first wall 31a can be favorably inhibited.

(15) The ground terminal 23 has a slit 43*a* provided to the linking portion 43, the slit 43*a* extending in the opening direction of the opening 33. In addition, the regulating portion 36 that extends in the opening direction of the opening 33 is provided convex on the inner surface of the first wall 31*a*, and the regulating portion 36 is inserted into the slit 43*a*. According to this configuration, displacement of the ground terminal 23 in the width direction X, which is orthogonal to the opening direction of the opening 33, can be regulated by the engagement of the regulating portion 36 with the slit 43*a*. This allows positional deviation of the ground terminal 23 in the width direction X to be inhibited when filling in the potting material 25, as described above.

(16) The slit 43*a* is formed spanning from the linking portion 43 to the step portion 45 that is between the linking portion 43 and the grounding portion 42. In addition, the retainer portion 37 extends in the opening direction from one end of the regulating portion 36 in the opening direction of the opening 33. Also, the retainer portion 37 extends through the slit 43*a* to a position that touches the second surface 42*c* of the grounding portion 42. According to this configuration, the retainer portion 37 that touches the second surface 42*c* of the grounding portion 42 can be formed in a way that elongates the regulating potion 36, yielding a favorable configuration for molding the housing 21.

The present embodiment can be modified as follows. The present embodiment and the following modifications can be combined with each other to the extent that the combination is not technically incompatible.

- Each of the ribs 31*d* of the first wall 31*a* may be configured to be capable of making contact with the capacitor 22. By doing so, a larger gap from the capacitor 22 can be formed on the first wall 31*a* side, as well, and filling in the potting material 25 becomes easier.
- A retainer portion that holds the reverse face side of the surface of the ground terminal 23 that faces the first wall 31*a* is not limited to the configuration of the retainer portion 37 in the embodiment described above, and may be modified as appropriate in response to the configuration of the ground terminal 23 or the housing 21. For example, the retainer portion may be configured to hold, on both width direction X edges of the ground terminal 23 (linking portion 43), the reverse face side of the surface of the ground terminal 23 (linking portion 43) that faces the first wall 31*a*. In such a configuration, the entire retainer portion 37 can be configured to be positioned within the housing 21, rather than the retainer portion 37 being configured to project upward through the opening 33 and outside the housing 21, as in the embodiment described above. Also, in such a configuration, the slit 43*a* of the ground terminal 23 and the regulating portion 36 that is inserted into the slit 43*a* can be omitted.
- The embodiment described above has a configuration where the potting material 25 is filled into the interior of the housing 21. However, regardless of whether there is any potting material 25, when the potting material 25 is omitted, a configuration is also possible where the opening 33 of the housing 21 is covered by a cover member or the like made of the same material as the housing 21, for example.
- In the embodiment described above, the noise filter 14 is not limited to eliminating noise (the load 12) from the defogger circuit for the rear windshield, and can be applied to vehicle devices other than the defogger circuit.
- In the embodiment described above, the noise filter wire 24 of the noise filter 14 is connected by splicing to the wire 13 of the wire harness 10, but the invention is not particularly limited to this. That is, so long as the noise filter wire 24 is electrically connected to the wire 13 of the wire harness 10, the invention can be modified to a configuration where the noise filter wire 24 is not directly connected to the wire 13 of the wire harness 10.

DESCRIPTION OF REFERENCE NUMERALS

10 . . . Wire harness
11 . . . Power source
12 . . . Load
13 . . . Wire
13*a* . . . Exposed portion
14 . . . Noise filter
21 . . . Housing
22 . . . Capacitor
22*a*, 22*b* . . . End face
23 . . . Ground terminal
24 . . . Noise filter wire
24*a* . . . First end
24*b* . . . Second end
24*c* . . . Exposed portion
25 . . . Potting material
31 . . . Outer circumferential wall
31*a* . . . First wall
31*b* . . . Second wall
31*c*, 31*d* . . . Rib
32 . . . Bottom
33 . . . Opening
34 . . . Wire lead-out portion
35 . . . Fixation portion
35*a* . . . Engagement portion
36 . . . Regulating portion
37 . . . Retainer portion
41 . . . Connecting portion
42 . . . Grounding portion
42*a* . . . Bolt insertion hole
42*b* . . . First surface
42*c* . . . Second surface
43 . . . Linking portion (contact portion, portion inside housing)
43*a* . . . Slit
45 . . . Step portion
P . . . Vehicle body panel
S . . . Splice terminal
f . . . Self-resonant frequency
X . . . Width direction
Y . . . Inward direction
Z . . . Height direction

The invention claimed is:

1. A noise filter connected to a wire of a wire harness that links a power source and a load, and eliminating noise transmitted from the power source to the load, comprising:
   a housing that includes a flat cylindrical outer circumferential wall, a bottom that seals one end of the outer circumferential wall, and an opening that is formed on the end of the outer circumferential wall that is on the opposite side from the bottom;
   a capacitor that is housed inside the outer circumferential wall;
   a ground terminal that is connected to one electrode of the capacitor; and
   a noise filter wire that electrically connects another electrode of the capacitor to the wire of the wire harness, wherein the ground terminal includes a portion inside the housing that is positioned inside the outer circumferential wall and a portion outside the housing that includes a grounding portion configured so as to extend outside the housing through the opening and be grounded on a vehicle body panel, the ground terminal is a plate member having a first surface and a second surface, and the housing makes contact with the first surface of the ground terminal at the portion of the ground terminal inside the housing and makes contact with the second surface of the ground terminal at the portion of the ground terminal outside the housing.

2. A noise filter eliminating noise transmitted from a power source to a load, comprising:

a housing;

a capacitor that is housed inside the housing;

a ground terminal installed on the housing and having a connecting portion that is connected to one electrode of the capacitor and a grounding portion that is grounded on a vehicle body panel; and a noise filter wire that has a first end connected directly to another electrode of the capacitor and a second end configured to be connected by splicing to a middle portion of a wire that links the power source to the load, wherein the capacitor includes flat end faces on two sides of a width direction that are configured as electrode surfaces of the capacitor, and the first end of the noise filter wire is directly connected to one width direction end face of the capacitor by welding or soldering.

3. A noise filter connected to a wire of a wire harness that links a power source and a load, and eliminating noise transmitted from the power source to the load, comprising:

a housing;

a capacitor that is housed inside the housing;

a ground terminal installed on the housing and having a connecting portion that is connected to one electrode of the capacitor and a grounding portion that is grounded on a vehicle body panel; and a noise filter wire that has a first end connected directly to another electrode of the capacitor and a second end connected by splicing to a middle portion of the wire of the wire harness, wherein the housing includes a cylindrical outer circumferential wall that encompasses four sides, a bottom that seals one end of the outer circumferential wall, and an opening that is formed on the end of the outer circumferential wall that is on the opposite side from the bottom, the outer circumferential wall is configured to include a first wall and a second wall that are parallel to each other, and the ground terminal includes a contact portion that is provided inside the outer circumferential wall and is in contact with the first wall, and the grounding portion extending from the contact portion extends outside the housing along an opening direction of the opening.

4. The noise filter according to claim 3, wherein the first wall includes a retainer portion that holds a reverse face side of a surface of the ground terminal that faces the first wall.

5. The noise filter according to claim 3, wherein the housing includes a fixation portion that is fixed to the vehicle body panel, and the fixation portion is integrally molded on the first wall so as to project from an outer surface of the first wall in a direction perpendicular to the opening direction of the opening.

6. The noise filter according to claim 3, wherein at least one of the first wall and the second wall is provided with two or more ribs that project toward a housing interior and are capable of making contact with the capacitor.

7. A noise filter connected to a wire of a wire harness that links a power source and a load, and eliminating noise transmitted from the power source to the load, comprising:

a housing;

a capacitor that is housed inside the housing;

a ground terminal installed on the housing and having a connecting portion that is connected to one electrode of the capacitor and a grounding portion that is grounded on a vehicle body panel;

a noise filter wire that has a first end connected directly to another electrode of the capacitor and a second end connected by splicing to a middle portion of the wire of the wire harness; and a potting material that is filled into the housing so as to cover the capacitor, the connecting portion, and the site of connection between the capacitor and the first end of the noise filter wire.

8. A wire harness comprising:

the noise filter according to claim 2; and the wire that links the power source to the load, wherein the noise filter wire is connected by splicing to the middle portion of the wire.

9. A noise filter connected to a wire of a wire harness that links a power source and a load, and eliminating noise transmitted from the power source to the load, comprising:

a housing that includes a cylindrical outer circumferential wall that encompasses four sides, a bottom that seals one end of the outer circumferential wall, and an opening that is formed on the end of the outer circumferential wall that is on the opposite side from the bottom;

a capacitor that is housed inside the outer circumferential wall;

a ground terminal that is connected to one electrode of the capacitor; and a noise filter wire that electrically connects another electrode of the capacitor to the wire of the wire harness, wherein the ground terminal includes a portion inside the housing that is positioned inside the outer circumferential wall and a grounding portion that extends outside the housing through the opening and is grounded on a vehicle body panel, and the outer circumferential wall is provided with a retainer portion that holds the ground terminal.

10. The noise filter according to claim 9, wherein the portion of the ground terminal inside the housing makes contact with an inner surface of a first wall that configures a portion of the outer circumferential wall, the retainer portion is provided on the inner surface of the first wall, and the retainer portion holds the ground terminal so as to maintain the state of contact of the portion inside the housing with the inner surface of the first wall.

11. The noise filter according to claim 10, wherein the housing has, on the outer surface of the first wall, a fixation portion that is fixed to the vehicle body panel.

12. The noise filter according to claim 11, wherein the portion inside the housing and the grounding portion that extends outside the housing from the portion inside the housing are both plate shaped, the grounding portion displaces toward the first wall relative to the portion inside the housing, which is in contact with the inner surface of the first wall, and the grounding portion is arranged so as to align with the first wall in a direction that is parallel to the opening direction of the opening.

13. The noise filter according to claim 12, wherein the grounding portion includes a first surface that is continuous with the surface of the portion inside the housing that is in contact with the inner surface of the first wall, and a second surface that is the reverse face of the first surface, the retainer portion is provided so as to extend out of the housing past the opening, and the retainer portion touches the second surface of the grounding portion.

14. The noise filter according to claim 13, wherein the ground terminal includes a slit that extends in the opening direction provided on the portion inside the housing, a regulating portion that extends in the opening direction is provided convex on the inner surface of the first wall, and the regulating portion is inserted into the slit.

15. The noise filter according to claim 14, wherein the slit is formed spanning from the portion inside the housing to a step portion that is between the portion inside the housing and the grounding portion, the retainer portion extends in the opening direction from one opening direction end of the regulating portion, and the retainer portion extends through the slit to a position that touches the second surface of the grounding portion.

16. The noise filter according to claim 9, wherein the ground terminal is a metal plate having a first surface and a second surface, the housing makes contact with the first surface of the ground terminal at the portion of the ground terminal inside the housing, and the housing makes contact with the second surface of the ground terminal at the portion of the ground terminal outside the housing.

17. The noise filter according to claim 9, wherein the ground terminal includes a step portion in a thickness direction of the ground terminal, with the step portion between the portion inside the housing and the portion outside the housing, and the step portion is configured such that a first surface of the ground terminal on the portion inside the housing and a second surface of the ground terminal on the portion outside the housing extend along the same plane in a cross-sectional view of the ground terminal.

* * * * *